United States Patent [19]

Kurokawa et al.

[11] Patent Number: 5,453,718

[45] Date of Patent: Sep. 26, 1995

[54] DIFFERENTIAL AMPLIFIER FOR REDUCING INPUT CAPACITANCE WITHOUT DETERORATING NOISE CHARACTERISTICS

[75] Inventors: Katuyuki Kurokawa; Takehiko Umeyama; Masayasu Tanaka, all of Sagamihara, Japan

[73] Assignees: Mitsubishi Denki Kabushiki Kaisha; Mitsubishi Electric Engineering Company Limited, both of Tokyo, Japan

[21] Appl. No.: 284,122

[22] Filed: Aug. 2, 1994

[30] Foreign Application Priority Data

Sep. 24, 1993 [JP] Japan ................................ 5-238324

[51] Int. Cl.$^6$ ................................................ H03F 3/45
[52] U.S. Cl. ................................................ 330/252; 330/292
[58] Field of Search ........................ 330/252, 260, 330/261, 292

[56] References Cited

U.S. PATENT DOCUMENTS 4,703,285 10/1987 Woo ........................................ 330/292 X
4,885,548 12/1989 Wakimoto et al. ........................ 330/260

FOREIGN PATENT DOCUMENTS 61-227413 10/1986 Japan.
2-27807 1/1990 Japan.

*Primary Examiner*—Steven Mottola
*Attorney, Agent, or Firm*—Oblon, Spivak, McClelland, Maier & Neustadt

[57] ABSTRACT

A differential amplifier (101) includes an input circuit (20), a bias circuit (31) and an output circuit (50). In the input circuit (20), when base potentials of transistors (Q1) and (Q2) change respectively by $\Delta V$ and $-\Delta V$ thereby changing current flowing through the transistors (Q1) and (Q2) by $\Delta I$ and $-\Delta I$, respectively, base-emitter voltages of transistors (Q5) and (Q9) equally increase by $\Delta V$ in the bias circuit (31). However, since a base potential of the transistor (Q5) is fixed, an emitter potential of the transistor (Q9) drops by $2\Delta V$, decreasing a base potential of a transistor (Q4) by $2\Delta V$. On the other hand, since a current flowing through the transistor (Q4) changes by $-\Delta I$, a base-emitter voltage of the transistor (Q4) accordingly falls by $\Delta V$. This reduces an emitter potential of the transistor (Q4), i.e., a collector potential of the transistor (Q2) by $\Delta V$, and hence, a base-emitter voltage of the transistor (Q2) stays unchanged. Thus, Miller effect is prevented and an input capacitance is reduced.

16 Claims, 10 Drawing Sheets

DIFFERENTIAL AMPLIFIER FOR REDUCING INPUT CAPACITANCE WITHOUT DETERORATING NOISE CHARACTERISTICS

BACKGROUND OF THE INVENTION

1. Field of the Invention

The present invention relates to a differential amplifier, and more particularly, to a technique for reducing an input capacitance of a differential amplifier.

2. Descriptions of the Background Art
A. Background Art

FIG. 6 is a circuitry diagram showing a structure of a conventional differential amplifier. The differential amplifier 200 comprises input terminals 2a and 2b, output terminals 2c and 2d, an input circuit 20 and an output circuit 50. The input circuit 20 includes NPN transistors Q1 and Q2 and a constant current source 1a. The output circuit 50 includes resistors 11 and 12.

The transistors Q1 and Q2 disposed in the input circuit 20 are designed identical to each other. Emitters of the transistors Q1 and Q2 are commonly connected to the constant current source 1a and grounded through the constant current source 1a. Bases of the transistors Q1 and Q2 are commonly connected to the input terminals 2a and 2b, respectively. The constant current source 1a carries a constant current $I_a$.

The resistors 11 and 12 disposed in the output circuit 50 equally have a resistance R, and one ends of the resistors 11 and 12 are commonly connected to a power source terminal 3. The power source terminal 3 receives a potential $V_C$ from a power source which is disposed external to the differential amplifier 200. The other end of the resistor 11 is connected to a collector of the transistor Q1 and the output terminal 2c, while the other end of the resistor 12 is connected to a collector of the transistor Q2 and the output terminal 2d.

A potential is supplied to the input terminals 2a and 2b from outside of the differential amplifier 200. For example, as shown in FIG. 6, a coil 10 is connected between the input terminals 2a and 2b. A Voltage is induced across the coil 10, and as a result, potentials $V_{2a}$ and $V_{2b}$ are supplied to the input terminals 2a and 2b, respectively.

Assuming here that the coil 10 is such a coil which is used as a head of a hard disk drive, for instance, as a magnetic member 90, i.e., the hard disk moves near the coil 10 as indicated by an arrow, a current flows through the coil 10. This current flowing in the coil 10 in turn develops a very small voltage as low as about 1m $V_{pp}$ across the coil 10.

The direction of the current which flows in the coil 10 changes depending on the direction of the movement and the polarity of the magnetic member 90. In accordance with the current value of this current, a corresponding amount of voltage is developed across the coil 10. The polarity of the voltage induced across the coil 10 changes depending on the direction of the current. In hereinafter describing an operation of the differential amplifier 200, the voltage thus induced is conceived to have a positive polarity when a potential at the input terminal 2a is higher than that at the input terminal 2b and to have a negative polarity when a potential at the input terminal 2a is lower than that at the input terminal 2b.

(A-1) Case Where There is No Potential Difference Between the Input Terminals 2a and 2b In this case, the input terminals 2a and 2b are at the same potential, and therefore, a base-emitter voltage $V_{BE1}$ of the transistor Q1 is equal to a base-emitter voltage $V_{BE2}$ of the transistor Q2. Since the emitters of the transistors Q1 and Q2 have the same configuration and the same surface area, a current passed by the emitter of the transistor Q1 is equal to a current passed by the emitter of the transistor Q2. In each emitter, the value of the current flowing therein is $I_a/2$, i.e., a half of the current value $I_a$ of the current which is supplied by the constant current source 1a.

Here, if the potential $V_C$ is set such that the collectors of the transistors Q1 and Q2 are at higher potentials than the bases of the transistors Q1 and Q2, in other words, such that the transistors Q1 and Q2 both operate in a non-saturation region, base currents in the transistors Q1 and Q2 can be ignored with respect to the emitter currents since the base currents are smaller than the emitter currents in the transistors Q1 and Q2. It then follows that each emitter current can be regarded as the current which flows from the associated collector.

Hence, a potential $V_{2c}$ available at the output terminal 2c is smaller than the potential $V_C$ which is provided to the power source terminal 3 by a multiplication product of the emitter current of the transistor Q1 and the resistance R of the resistor 11. Similarly, a potential $V_{2d}$ supplied to the output terminal 2d is smaller than the potential $V_C$ by a multiplication product of the emitter current of the transistor Q2 and the resistance R of the resistor 12. Since the currents flowing through the transistors Q1 and Q2 are both equally $I_a/2$, the potentials $V_{2c}$ and $V_{2d}$ are both equally $V_C-(I_1/2)\cdot R$.

FIG. 7 is a waveform diagram showing potentials at the respective parts of the differential amplifier 200. The exemplary situation described under (A-1) occurs at time $t_0$ in FIG. 7.

(A-2) Case Where There is a Positive Potential Difference Between the Input Terminals 2a and 2b As the situation described under (A-1) changes and a positive potential difference is created between the input terminals 2a and 2b, that is, when the potential $V_{2a}$ is raised above the potential $V_{2b}$, the base-emitter voltage $V_{BE1}$ of the transistor Q1 becomes greater than the base-emitter voltage $V_{BE2}$ of the transistor Q2. As this occurs, the current flowing into the emitter of the transistor Q1 grows and the current flowing into the emitter of the transistor Q2 reduces.

This is because the emitters of the transistors Q1 and Q2 are commonly connected to the constant current source 1a and the total current value of the emitter currents of the transistors Q1 and Q2 is fixed at the constant current value $I_a$.

The potential $V_{2c}$ drops from the value $V_C-(I_a/2)\cdot R$ by a multiplication product of the increase in the emitter current of the transistor Q1 and the resistance R, whereas the potential $V_{2d}$ increases from the value $V_C-(I_a/2)\cdot R$ by a multiplication product of the drop in the emitter current of the transistor Q2 and the resistance R. For instance, where the potentials $V_{2a}$ and $V_{2b}$ each change by 0.5 mV and the gain of the differential amplifier 200 is about 30, changes in the potentials $V_{2c}$ and $V_{2d}$ are about 15 mV.

Although changing by the same amount, the potentials $V_{2c}$ and $V_{2d}$ change in different directions. If the potential difference between the potentials $V_{2c}$ and $V_{2d}$ is amplified in the manner described above, when the potentials $V_{2a}$ and $V_{2b}$ are about 1 mV apart from each other, a potential difference between the potentials $V_{2c}$ and $V_{2d}$ will be amplified to about 30 mV. This corresponds to time $t_1$ in FIG. 7.

(A-3) Case Where There is a Negative Potential Difference Between the Input Terminals 2a and 2b This situation occurs when the transistors Q1 and Q2 operate in an opposite manner in the case (A-2). That is, the potential $V_{2c}$ is greater than the potential $V_{2d}$ by about 30 mV. In this situation, the potentials $V_{2a}$ and $V_{2b}$ have opposite polarities as shown in FIG. 7. If the potentials $V_{2a}$ and $V_{2b}$ are each expressed as a sinusoidal wave having a peak-to-peak amplitude of $V_{in}$=1 mV, the potentials $V_{2c}$ and $V_{2d}$ will be sinusoidal waves of an amplitude $V_{out}$=30 mV and have different polarities.

(A-4) Problem

In general, a bipolar transistor includes a parasitic capacitance between its base and its collector. In FIG. 6, parasitic capacitances in the transistors Q1 and Q2 which form the input circuit 20 of the differential amplifier 200 are indicated at $C_1$ and $C_2$, respectively. These parasitic capacitances create Miller effect which increases an input capacitance. Miller effect more strongly influences an amplifier element as the amplification degree of the amplifier element increases. With respect to the transistor Q1, for example, the greater the value ($V_{2a}-V_{2c}$) is, the stronger Miller effect becomes, and hence, the larger the input capacitance becomes. With respect to the transistor Q2, the input capacitance increases as the value ($V_{2b}-V_{2d}$) becomes larger. Thus, the capacitance value of an input capacitance has a dependency on a base-collector voltage $V_{BC}$ of a transistor.

On the other hand, as can be seen in FIG. 7, the potential $V_{2a}$ which appears at the base of the transistor Q1 and the potential $V_{2c}$ which appears at the collector of the transistor Q1 have opposite phases. Where the amplification degree of the differential amplifier is 30, an input capacitance about 31 times as large as the capacitance $C_1$ is applied to the input terminal 2a. In a similar manner, an increased input capacitance is applied to the input terminal 2b.

The input capacitances and the coil 10 which is connected to the input terminals 2a and 2b form an LC resonator. At the resonance frequency $f_0$, the amplification degree of the differential amplifier shows an abrupt change. FIG. 8 is a graph showing the frequency-dependency of the amplification degree. The amplification degree stays almost unchanged in a region sufficiently smaller than the resonance frequency $f_0$, however, the frequency-dependency of the amplification degree becomes greater as approaching the resonance frequency $f_0$. For instance, the frequency-dependency is remarkably strong around a skirt portion $G_p$ of the graph.

Where a head coil of a hard disk is used as the coil 10, the resonance frequency $f_0$ must be set sufficiently higher than a frequency at which the polarity of the voltage which is developed across the coil 10 switches so that the amplifier will not perform amplification around the graph skirt portion $G_p$. However, when the resonance frequency $f_0$ of the LC resonator falls due to increases in the capacitance values of the input capacities, the graph skirt portion $G_p$ reaches almost the frequency of the voltage which is developed across the coil 10 (including a 3-order or higher harmonics), thereby intensifying the frequency-dependency of the amplification degree.

Particularly when the voltage which is induced across the coil 10 is very small, the transistors Q1 and Q2 need be large, and therefore, the parasitic capacitances $C_1$ and $C_2$ are inevitably large. Hence, the input capacitances grow largely due to Miller effect, resulting in a stronger distortion in an output signal.

(A-5) First Approach to the Problem

A differential amplifier which suppresses Miller effect at the transistors Q1 and Q2 has been proposed, aiming at reducing the input capacitances in the input circuit 20 and processing a week input signal without much distorting the same.

FIG. 9 is a circuitry diagram showing a structure of such a differential amplifier 201. The differential amplifier 201 additionally comprises a bias circuit 30 between the input circuit 20 and the output circuit 50, but is otherwise the same as the differential amplifier 200.

The bias circuit 30 includes NPN transistors Q3 and Q4 which each receive at its base a potential $V_B$ from a power source. Emitters of the transistors Q3 and Q4 are connected to the collectors of the transistors Q1 and Q2 of the input circuit 20, while collectors of the transistors Q3 and Q4 are connected to the output terminals 2c and 2d, respectively. In other words, between the power source terminal 3 and the ground GND, the resistor 11, the transistor Q3, the transistor Q1 and the constant current source 1a are connected in series in this order. It is also between the power source terminal 3 and the ground GND that the resistor 12, the transistor Q4, the transistor Q2 and the constant current source 1a are connected in series in this order.

FIG. 10 is a waveform diagram showing potentials at the respective parts of the differential amplifier 201. Where the amplification degree of the differential amplifier 201 is approximately 30 and the potentials $V_{2a}$ and $V_{2b}$ supplied respectively to the input terminals 2a and 2b are 180 degrees out of phase from each other and are each a sinusoidal wave which have a peak-to-peak amplitude of $V_{in}$=1 mV, the potentials $V_{2c}$ and $V_{2d}$ change 180° out of phase from each other as shown in FIG. 10, manifesting themselves each as a sinusoidal wave having a peak-to-peak amplitude of $V_{out}$=30 mV. Disregarding a base current which flows through the transistor Q3, collector currents flowing through the transistors Q1 and Q3 are equal to each other.

On the other hand, a base-emitter voltage $V_{BE3}$ of the transistor Q3 changes in a similar manner to the base-emitter voltage $V_{BE1}$ of the transistor Q1 as described later. Since a potential at the base of the transistor Q3 is fixed at the potential $V_B$, a potential $V_3$ at the emitter of the transistor Q3 (i.e., at the collector of the transistor Q1) changes 180° out of phase from the potential $V_{2a}$ at an amplitude which is equal to $V_{in}$. Hence, a variation in the base-collector voltage of the transistor Q1 is limited to the range of ±1 mV. Likewise, a potential $V_4$ at the collector of the transistor Q2 changes out of phase from the potential $V_{2b}$, and a fluctuation in the base-collector voltage of the transistor Q2 is limited to the range of ±1 mV.

From the time $t_0$ to the time $t_1$, the potential $V_{2a}$ rises 0.5 mV and the potential $V_{2b}$ drops 0.5 mV. This increases the emitter current flowing through the transistor Q1 and reduces the emitter current flowing through the transistor Q2 as in the differential amplifier 200. As a result, the base-emitter voltage $V_{BE3}$ of the transistor Q3 increases by 0.5 mV while the base-emitter voltage $V_{BE4}$ of the transistor Q4 decreases by 0.5 mV. Hence, the base potential of the transistor Q1 increases by 0.5 mV while the collector potential of the transistor Q1 drops by 0.5 mV so that the base-emitter voltage $V_{BE1}$ of the transistor Q1 falls by 1 mV. At the same time, the base potential of the transistor Q2 drops by 0.5 mV while the collector potential of the transistor Q2 increases by 0.5 mV so that the base-emitter voltage $V_{BE2}$ of the transistor Q2 increases by 1 mV. Consequently, if the potentials $V_{2a}$ and $V_{2b}$ are sinusoidal waves, the polarities will change and the base-emitter voltages of the transistors Q1 and Q2 will vary within the range of ± 1 mV.

The reason why the base-emitter voltage of the transistor Q3 changes in a similar manner to the base-emitter voltage of the transistor Q1 can be explained as follows using equations. Disregarding the base current, and assume that a current $I_0=I_a/2$ flows between the collector and the emitter in each one of the transistors Q1 and Q2 when the potentials $V_{2a}$ and $V_{2b}$ given to the bases of the transistors Q1 and Q2 are equally $V_0$ and that the emitter potentials of the transistors Q1 and Q2 are both $V_Q$. Under such circumstances, when the potentials $V_{2a}$ and $V_{2b}$ become $V_0+\Delta V$ and $V_0-\Delta V$, respectively, the potential $V_Q$ remains unchanged and the emitter current in the transistor Q1 increases to $I_0+\Delta I$ while the emitter current in the transistor Q2 decreases to $I_0-\Delta I$ since the transistors Q1 and Q2 have the same structure. Since the potential $V_Q$ does not change, a change in the base-emitter voltage $V_{BE1}$ of the transistor Q1 is equal to $\Delta V$, and therefore, Shockley's equation holds between the base-emitter voltage $V_{BE1}$ and the emitter currents:

$$\Delta V = \frac{kT}{q} \cdot \ln\left(\frac{I_0+\Delta I}{I_0}\right) \quad (1)$$

These emitter currents are equal to each other since the transistors Q1 and Q3 are connected in series to each other. Hence, the emitter current of the transistor Q3 is $I_0$ when the potentials $V_{2a}$ and $V_{2b}$ are equally $V_0$, and amounts to $I_0+\Delta I$ if the potentials $V_{2a}$ and $V_{2b}$ change to $V_0+\Delta V$ and $V_0-\Delta V$, respectively. Therefore, from Shockley's equation, a change $\Delta V_{BE3}$ in the base-emitter voltage of the transistor Q3 is:

$$\Delta V_{BE3} = \frac{kT}{q} \cdot \ln\left(\frac{I_0+\Delta I}{I_0}\right) \quad (2)$$

Thus, it is found from Eqs. (1) and (2) that the change $\Delta V_{BE3}$ is equal to the change $\Delta V$ in each of the potentials $V_{2a}$ and $V_{2b}$.

Hence, $V_3=V_B-V_{BE3}$ $V_3=V_Q+V_{BE1}+V_{BC1}$ (3)

From Eq. (3), Eq. (4) below is yielded. The left-hand side of Eq. 4 has a constant value.

$V_B-V_Q=(V_{BE1}+V_{BE3})+V_{BC1}$ (4)

As described earlier, since the voltages $V_{BE1}$ and $V_{BE3}$ change in phase with the potential $V_{2a}$ by the same amount of variation $\Delta V$, a voltage $V_{BC1}$ changes by an amount $2\Delta V$ 180° out of phase from the potential $V_{2a}$. That is, the potentials $V_{2a}$ and $V_{2b}$ change to $V_0+\Delta V$ and $V_0-\Delta V$, respectively, so that the voltage $V_{BC1}$ decreases by $2\Delta V$. To the contrary in the transistor Q2, its base-collector voltage $V_{BC2}$ increases by $2\Delta V$.

Thus, in the differential amplifier 201, although the base-collector voltages $V_{BC1}$ and $V_{BC2}$ of the transistors Q1 and Q2 will not change as much as in the differential amplifier 200, there still clearly are fluctuations in the base-collector voltages and Miller effect remains reasonably influential. This is particularly undesirable when an input signal to the differential amplifier 201 is very week since the weaker the input signal to the differential amplifier 201 is, more greatly distorted the input signal will be by even a slight increase in the capacitance.

(A-6) Second Approach to the Problem

As measures to eliminate the influence of the distortion, the capacitance values of the parasitic capacitances $C_1$ and $C_2$ of the transistors Q1 and Q2 may be set small enough to be free from the influence of Miller effect. In short, this is to reduce the base-emitter contact areas of the transistors Q1 and Q2.

However, to realize this, the bases must be formed small, which naturally requires reductions in the emitter areas in the base regions. Therefore, this approach unadvantageously increases the base resistances and the emitter resistances, and will sacrifice the noise characteristics.

SUMMARY OF THE INVENTION

A differential amplifier according to the present invention comprises: (a) a first and a second input terminals; (b) a first differential input part, including: (b-1) a first amplifier element including an input terminal and an output terminal, the input terminal of the first amplifier being connected to the first input terminal; (b-2) a second amplifier element including an input terminal and an output terminal, the input terminal of the second amplifier being connected to the second input terminal; and (b-3) a first current source which is connected at a first contact point to the first and the second amplifier elements, the first current source maintaining a sum of currents which flow from the output terminals of the first and the second amplifier elements at a first constant current value; (c) a second differential input part, including: (c-1) a third amplifier element including an input terminal and an output terminal, the input terminal of the third amplifier being connected to the first input terminal; (c-2) a fourth amplifier element including an input terminal and an output terminal, the input terminal of the fourth amplifier being connected to the second input terminal; and (c-3) a second current source which is connected at a second contact point to the third and the fourth amplifier elements, the second current source maintaining a sum of currents which flow from the output terminals of the third and the fourth amplifier elements at a second constant current value; (d) a first current/voltage conversion element including an input terminal and an output terminal which is connected to the output terminal of the third amplifier element; (e) a second current/voltage conversion element including an input terminal and an output terminal which is connected to the output terminal of the fourth amplifier element; (f) a third current/voltage conversion element including an input terminal which is provided with a fixed potential and an output terminal which is connected to the input terminal of the first current/voltage conversion element; (g) a fourth current/voltage conversion element including an input terminal which is provided with the fixed potential and art output terminal which is connected to the input terminal of the second current/voltage conversion element; (h) a fifth current/voltage conversion element including an input terminal which is connected to the output terminal of the second current/voltage conversion element and an output terminal which is connected to the output terminal of the first current/voltage conversion element; (i) a sixth current/voltage conversion element including an input terminal which is connected to the output terminal of the first current/voltage conversion element and an output terminal which is connected to the output terminal of the second current/voltage conversion element; (j) a seventh current/voltage conversion element for converting a current which flows through the fifth current/voltage conversion element into a voltage; and (k) an eighth current/voltage conversion element for converting a current which flows through the sixth current/voltage conversion element into a voltage. In the first amplifier element, a potential difference between its input and output terminals is expressed as a multiplication product of logarithms of currents which flow into and from its input and output terminals and a first coefficient. In the second amplifier element, a potential difference between its input and output terminals is expressed as a multiplication product of logarithms of currents which flow into and from its input and output terminals and the first coefficient. In the third amplifier element, a potential difference between its input and output terminals is expressed as a multiplication product of logarithms of currents which flow into and from its input and output terminals and a second coefficient. In the fourth amplifier element, a potential difference between its input and output terminals is expressed as a multiplication product of logarithms of currents which flow into and from its input and output terminals and the second coefficient. In the first current/voltage conversion element, a potential difference between its input and output terminals is expressed as a multiplication product of logarithms of currents which flow into and from its input and output terminals and a third coefficient. In the second current/voltage conversion element, a potential difference between its input and output terminals is expressed as a multiplication product of logarithms of currents which flow into and from its input and output terminals and the third coefficient. In the third current/voltage conversion element, a potential difference between its input and output terminals is expressed as a multiplication product of logarithms of currents which flow into and from its input and output terminals and a fourth coefficient. In the fourth current/voltage conversion element, a potential difference between its input and output terminals is expressed as a multiplication product of logarithms of currents which flow into and from its input and output terminals and the fourth coefficient, In the fifth current/voltage conversion element, a potential difference between its input and output terminals is expressed as a multiplication product of logarithms of currents which flow into and from its input and output terminals and a fifth coefficient. In the sixth current/voltage conversion element, a potential difference between its input and output terminals is expressed as a multiplication product of logarithms of currents which flow into and from its input and output terminals and the fifth coefficient. Potentials supplied to the first and the second input terminals are amplified and respectively fed to the seventh and the eighth current/voltage conversion elements.

Preferably, potentials supplied to the first and the second input terminals have such values which force the first and the second contact points to each stay at a constant potential.

Preferably, potentials which complement one another are supplied to the first and the second input terminals.

Preferably, a coil is connected to the first and the second input terminals, and changes in a magnetic field which develops in the vicinity of the coil are converted into potentials and supplied to the first and the second input terminals.

The magnetic field preferably changes as a magnetic recording medium moves, and the coil is preferably a head coil which is used in correspondence to the magnetic recording medium.

The magnetic recording medium may be a hard disk.

Alternatively, the magnetic recording medium may be a flexible disk.

Preferably, first amplifier element includes (b-1-1) a first transistor having a control electrode which is connected to the input terminal of the first amplifier element, a first electrode which is connected to the output terminal of the first amplifier element and a second electrode which is connected to the first contact point, the second amplifier element includes (b-2-1) a second transistor having a control electrode which is connected to the input terminal of the second amplifier element, a first electrode which is connected to the output terminal of the second amplifier element and a second electrode which is connected to the first contact point, and the first and the second transistors are constructed to have the same design.

It is preferable that the third amplifier element includes (c-1-1) a third transistor having a control electrode which is connected to the input terminal of the third amplifier element, a first electrode which is connected to the output terminal of the first amplifier element and a second electrode which is connected to the second contact point, the fourth amplifier element includes (c-2-1) a fourth transistor having a control electrode which is connected to the input terminal of the fourth amplifier element, a first electrode which is connected to the output terminal of the fourth amplifier element and a second electrode which is connected to the second contact point, and the third and the fourth transistors are constructed to have the same design.

The first current/voltage conversion element may include (d-1) a fifth transistor having a control electrode and a first electrode which are connected in common to the input terminal of the first current/voltage conversion element and a second electrode which is connected to the output terminal of the first current/voltage conversion element, the second current/voltage conversion element may include (e-1) a sixth transistor having a control electrode and a first electrode which are connected in common to the input terminal of the second current/voltage conversion element and a second electrode which is connected to the output terminal of the second current/voltage conversion element, and preferably, the fifth and the sixth transistors are constructed to have the same design.

Alternatively, the first current/voltage conversion element includes (d-2) a first diode having a first end which is connected to the input terminal of the first current/voltage conversion element and a second end which is connected to the output terminal of the first current/voltage conversion element, the second current/voltage conversion element includes (e-2) a second diode having a first end which is connected to the input terminal of the second current/voltage conversion element and a second end which is connected to the output terminal of the second current/voltage conversion element, and the first and the second diodes are constructed to have the same design.

Further alternatively, the first current/voltage conversion element includes (d-3) a first resistor having a first end which is commonly connected to the input terminal of the first current/voltage conversion element and a second end which is connected to the output terminal of the first current/voltage conversion element, the second current/voltage conversion element includes (e-3) a second resistor having a first end which is connected to the input terminal of the second current/voltage conversion element and a second end which is connected to the output terminal of the second current/voltage conversion element, and the first and the second resistors are constructed to have the same design.

Preferably, the third current/voltage conversion element includes (f-1) a seventh transistor having a control electrode which is connected to the input terminal of the third current/voltage conversion element, a first electrode and a second electrode which is connected to the output terminal of the third current/voltage conversion element, the fourth current/ voltage conversion element includes (g-1) an eighth transistor having a control electrode which is connected to the input terminal of the fourth current/voltage conversion element, a first electrode and a second electrode which is connected to the output terminal of the fourth current/voltage conversion element, seventh and the eighth transistors are constructed to have the same design, and equal potentials are supplied to the first electrodes of the seventh and the eighth transistors.

Preferably, the fifth current/voltage conversion element includes (h-1) an ninth transistor having a control electrode which is connected to the input terminal of the fifth current/voltage conversion element, a first electrode which is connected to the seventh current/voltage conversion element and a second electrode which is connected to the output terminal of the fifth current/voltage conversion element, the sixth current/voltage conversion element includes (i-1) a tenth transistor having a control electrode which is connected to the input terminal of the sixth current/voltage conversion element, a first electrode which is connected to the eighth current/voltage conversion element and a second electrode which is connected to the output terminal of the sixth current/voltage conversion element, the ninth and the tenth transistors are constructed to have the same design, and the first electrodes of the ninth and the tenth transistors are connected to each other via the seventh and the eighth current/voltage conversion elements which are connected in series to each other.

Preferably, the seventh current/voltage conversion element includes (j-1) a first resistor having a first end and a second end, the first end of the first resistor being connected to the first electrode of the ninth transistor, the eighth current/voltage conversion element includes (k-1) a second resistor having a first end and a second end, the first end of the second resistor being connected to the first electrode of the tenth transistor, and equal potentials are supplied to the second ends of the first and the second resistors.

The differential amplifier may further comprise a bias circuit which biases both the first and the second input terminals.

Thus, in the differential amplifier of the present invention, the potential change $\Delta V$ which is supplied to the input terminal of the first amplifier element is converted into the change $\Delta I$ in the current which is allowed from the output terminal of the first amplifier element. The change $\Delta I$ is created also in the third amplifier element. This change in current is converted into the voltage change $\Delta V$ in both the first and the third current/voltage conversion elements. However, since the potential at the input terminal of the third current/voltage conversion element is fixed, a potential change of $-2\Delta V$ is created at the contact point between the output terminal of first amplifier element and the first current/voltage conversion element. The potential change of $-2\Delta V$ is supplied to the input terminal of the sixth current/voltage conversion element.

On the other hand, the second amplifier element receives at its input terminal a potential which varies by $-\Delta V$. The current flowing into the sixth current/voltage conversion element is equal to the current flowing from the output terminal of the second amplifier element, and changes by $-\Delta I$. Therefore, the sixth current/voltage conversion element has a voltage difference of $-\Delta V$ between its input and output terminals. In response to this, the potential at the output terminal of the fifth current/voltage conversion element changes by $-2\Delta V-(-\Delta V)=-\Delta V$, or the same amount of change as the change in the potential at the input terminal of the second current/voltage conversion element, in phase with the potential at the input terminal of the second current/voltage conversion element. Hence, Miller effect is prevented in the second current/voltage conversion element.

As heretofore described, since Miller effect is prevented in the present invention, it is possible to minimize the influence of a parasitic capacitance of the first differential input part over an input capacitance. Thus, the differential amplifier has a reduced input capacitance.

Accordingly, it is an object of the present invention to offer a differential amplifier which suppresses a variation in an input capacitance to a very small amount without deteriorating its noise characteristics.

These and other objects, features, aspects and advantages of the present invention will become more apparent from the following detailed description of the present invention when taken in conjunction with the accompanying drawings.

DESCRIPTION OF THE PREFERRED EMBODIMENTS

C. First Preferred Embodiment
(C-1) Structure

Figure 1:
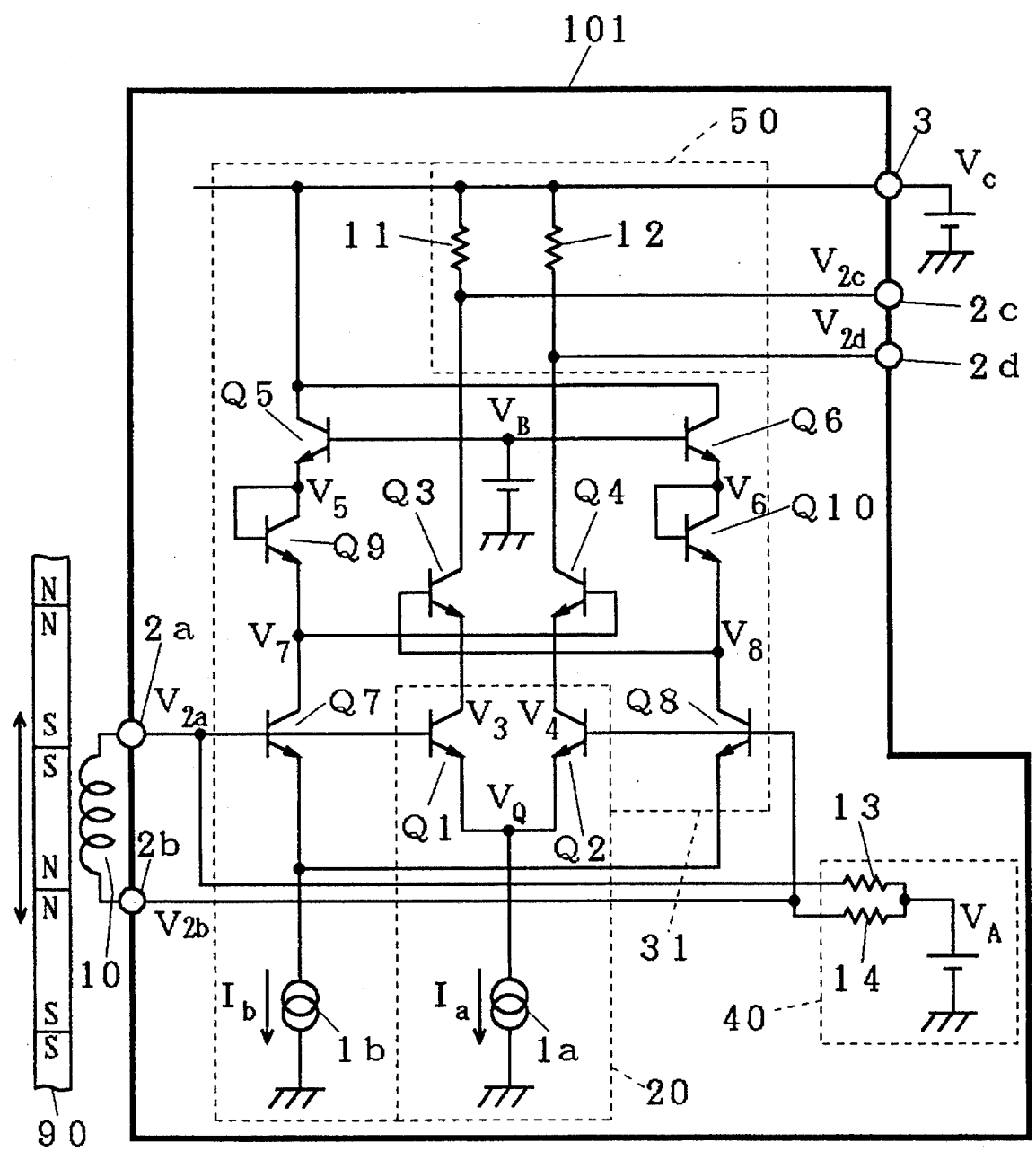
FIG. 1 is a circuitry diagram showing a structure according to a first preferred embodiment of the present invention.

FIG. 1 is a circuitry diagram showing a structure of a differential amplifier 101 according to a first preferred embodiment of the present invention. The differential amplifier 101 is identical in structure to the differential amplifier 201 except that the bias circuit 30 is replaced with a bias circuit 31 and an input bias circuit 40 which is connected to the bias circuit 30 is additionally disposed.

Figure 2:
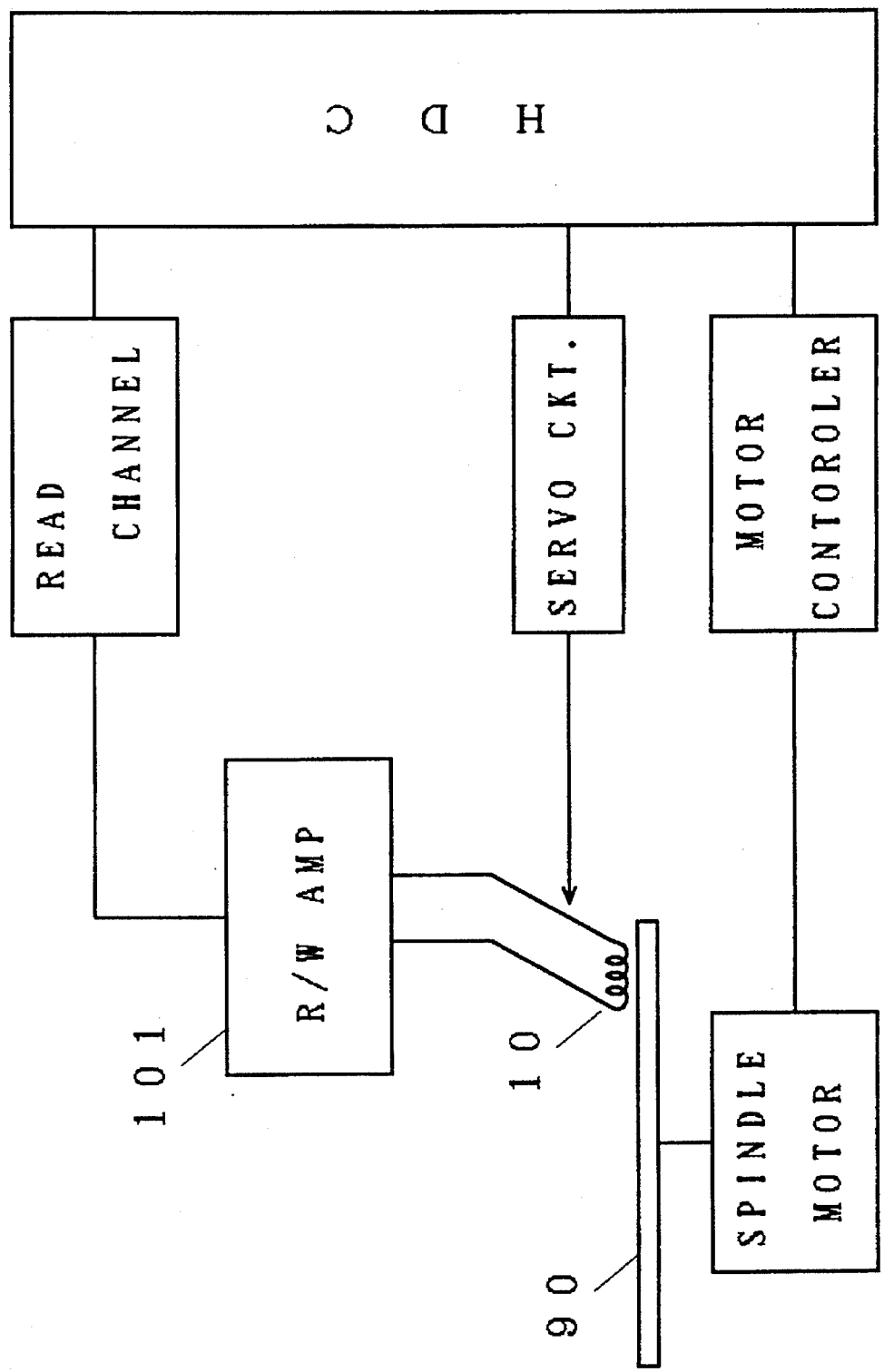
FIG. 2 is a block diagram showing a system adopting the present invention.

FIG. 2 is a block diagram showing an overall structure of a hard disk system in which the differential amplifier 101 is utilized. The magnetic member 90 rotated or otherwise appropriately moved by a spindle motor which is driven under the control of a motor controller, thereby causing a change in a magnetic flux which will be detected by the coil 10. The coil 10 is moved by a servo circuit. The differential amplifier 101 is used as an R/W amplifier, and an output thereof is supplied to a hard disk controller (HDC) via a read channel. The hard disk controller also controls the servo circuit, the motor controller and etc. Although descriptions hereinbelow deal with where the magnetic member 90 is a hard disk, a flexible disk may be used as the magnetic member 90 to obtain the same results described below.

The bias circuit 31 includes NPN transistors Q3 to Q8 and a constant current source 1b. Bases of the transistors Q7 and Q8 are connected to the input terminals 2a and 2b, respectively. Emitters of the transistors Q7 and Q8 are connected in common to each other and grounded through the constant current source 1b. Therefore, as viewed from the input terminals 2a and 2b, the transistors Q7 and Q8 and the constant current source 1b are connected to each other in the same manner as that in which the transistors Q1 and Q2 and the constant current source 1a are connected to each other. The transistors Q7 and Q8 have identical design.

As in the bias circuit 30, emitters of the transistors Q3 and Q4 are connected to the collectors of the transistors Q1 and Q2, respectively, and collectors of the transistors Q3 and Q4 are connected to the output terminals 2c and 2d, respectively. However, unlike in the bias circuit 30, bases of the transistors Q3 and Q4 are connected to the collectors of the transistors Q8 and Q7, respectively. The transistors Q3 and Q4 are identical to each other in structure.

The potential $V_C$ is commonly supplied to collectors of the transistors Q5 and Q6 while the potential $V_B$ is commonly supplied to bases of the transistors Q5 and Q6. Emitters of the transistors Q5 and Q6 are respectively connected to the collectors of the transistors Q7 and Q8 through the transistors Q9 and Q10. That is, the base and the collector of the transistor Q9 are commonly connected to the emitter of the transistor Q5 while the collector of the transistor Q7 and the base of the transistor Q4 are commonly connected to the emitter of the transistor Q9. The base and the collector of the transistor Q10 are commonly connected to the emitter of the transistor Q6, and the collector of the transistor Q8 and the base of the transistor Q3 are commonly connected to the emitter of the transistor Q10. The transistors Q5 and Q6 are identical in design to each other, and so are the transistors Q9 and Q10.

The input bias circuit 40 is connected to the input terminals 2a and 2b. The input bias circuit 40 includes resistors 13 and 14, and the potential $V_A$ is commonly supplied to one ends of the resistors 13 and 14. The other ends of the resistors 13 and 14 are connected to the input terminals 2a and 2b, respectively.

(C-2) Descriptions of Operations

The transistors Q5 and Q9 feed a collector current into the transistor Q7, and serve as a first potential generating circuit which changes a collector potential $V_7$ of the transistor Q7 with respect to the potential $V_B$ in accordance with a change in the collector current flowing through the transistor Q7.

The transistors Q6 and Q10 provide a collector current to the transistor Q8, and serve as a second potential generating circuit which changes a collector potential $V_8$ of the transistor Q8 with respect to the potential $V_B$ in accordance with a change in the collector current flowing through the transistor Q8.

Since the collector potential $V_8$ of the transistor Q8 is given to the base of the transistor Q3, an emitter potential $V_3$ of the transistor Q3 changes in accordance with the base-emitter voltage $V_{BE3}$ of the transistor Q3 and the potential $V_8$. As for the transistor Q4, since the base of the transistor Q4 receives the collector potential $V_7$ of the transistor Q7, an emitter potential $V_4$ of the transistor Q4 changes in accordance with the base-emitter voltage $V_{BE4}$ of the transistor Q4 and the potential $V_7$.

In the following, descriptions will be given on operations of the amplifier of where such a coil as that used in a head of a hard disk is used as the coil 10 and a subtle potential difference as small as about 1 $mV_{pp}$ is induced across the coil 10 by moving the magnetic member 90 in the same manner as in the conventional amplifier.

(C-3) Case Where There is No Potential Difference Between the Input Terminals 2a and 2b This corresponds to a case where no voltage is developed across the coil 10 and therefore the potentials $V_{2a}$ and $V_{2b}$ at the input terminals 2a and 2b are equally the potential $V_0$ because of existence of the input bias circuit 40.

In this case, the base-emitter voltages $V_{BE1}$ and $V_{BE2}$ of the transistors Q1 and Q2 are equal to each other, and the transistors Q1 and Q2, being designed to have the same structure, have the same emitter configuration and the same emitter surface area. Hence, emitter currents of the transistors Q1 and Q2 each become half the current $I_a$ which flows through the constant current source 1a, and the emitter potentials $V_3$ and $V_4$ of the transistors Q1 and Q2 are equal to each other.

The potential $V_{2c}$ fed to the output terminal 2c falls to a remainder of the potential $V_C$ minus a voltage drop which is caused at the resistor 11 by the emitter current of the transistor Q3, while the potential $V_{2d}$ which appears at the output terminal 2d falls to a remainder of the potential $V_C$ minus a voltage drop which is caused at the resistor 12 by the emitter current of the transistor Q4.

Here, assume that the transistors Q1, Q2, Q7 and Q8 operate in a non-saturation region and that their base currents are much smaller than their emitter currents so that their base currents can be ignored. It then follows that the emitter current can be regarded as equal to the collector current in each transistor.

Since the transistors Q3 and Q4 are connected in series to the transistors Q1 and Q2, respectively, the emitter currents of the transistors Q3 and Q4 are each equal to $I_a/2$. In addition, since the resistors 11 and 12 have the same resistance R, the potentials $V_{2c}$ and $V_{2d}$ are each equal to $V_C-(I_a/2)\cdot R$.

This is also true about the transistors Q7 and Q8 of the bias circuit 31. The base-emitter voltages $V_{BE7}$ and $V_{BE8}$ of the transistors Q7 and Q8 are equal to each other, and therefore, the emitter currents of the transistors Q7 and Q8 are each half the current $I_b$ which flows through the constant current source 1b. Since the transistors Q5 and Q6 have the same design and so are the transistors Q9 and Q10, the emitter potentials $V_5$ and $V_6$ of the transistors Q5 and Q6 are equal to each other and the emitter potentials $V_9$ and $V_{10}$ of the transistors Q9 and Q10 are equal to each other.

Figure 3:
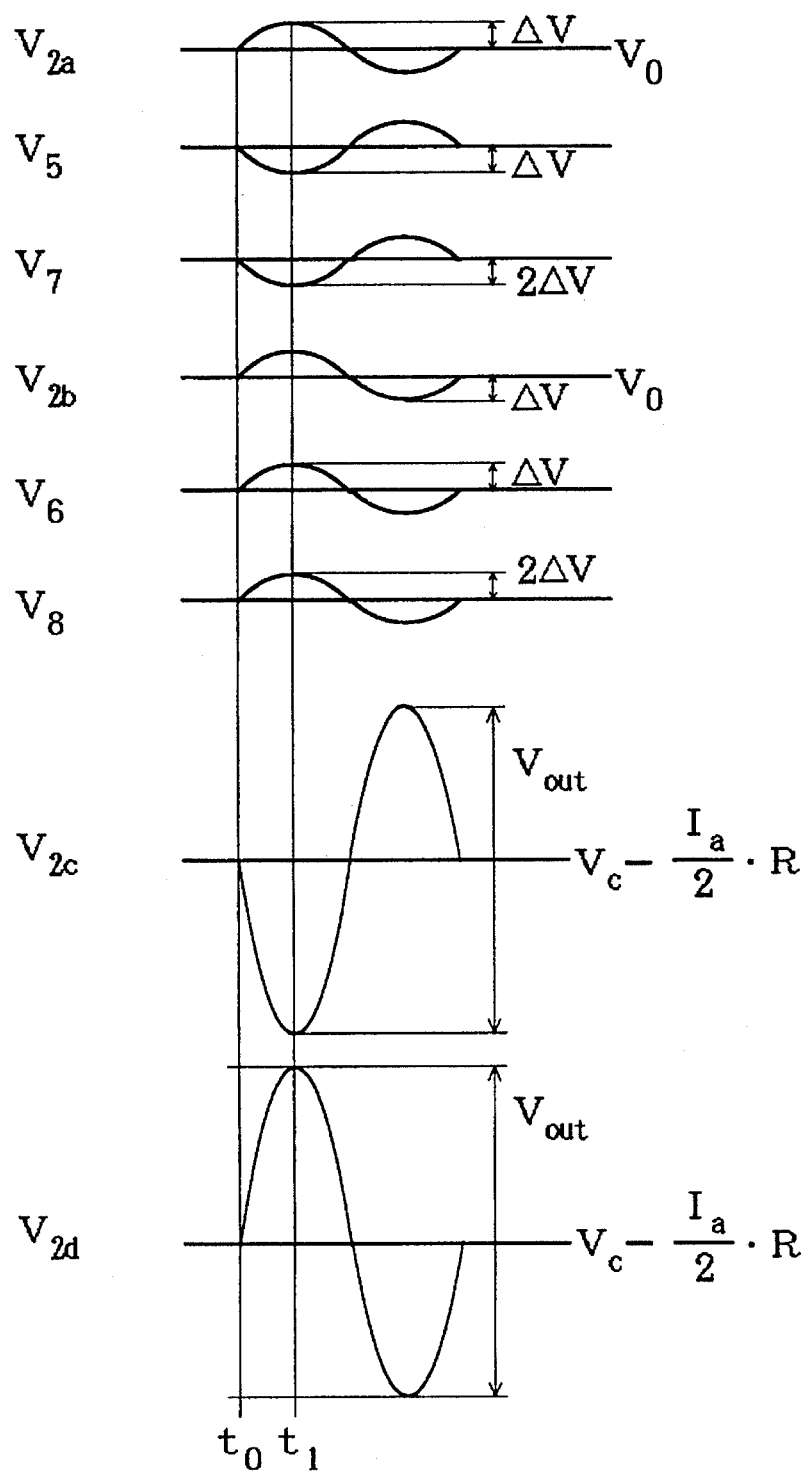
FIG. 3 is a graph showing an operation in the first preferred embodiment of the present invention.

FIG. 3 is a waveform diagram showing potentials at the respective parts of the differential amplifier 101. The situation described above occurs at time $t_0$ in FIG. 3.

(C-4) Descriptions of Operations

Assume that a voltage of $2\Delta V$ is developed across the coil 10 thereby increasing the potential $V_{2a}$ to $V_0+\Delta V$ and reducing the potential $V_{2b}$ to $V_0-\Delta V$. Since the potential $V_{2a}$ is larger than the potential $V_{2b}$, the base-emitter voltage $V_{BE1}$ of the transistor Q1 becomes greater than the base-emitter voltage $V_{BE2}$ of the transistor Q2. Since the emitters of the transistors Q1 and Q2 are commonly connected to the constant current source 1a, the sum of the emitter currents of the transistors Q1 and Q2 is equal to the current $I_a$. Hence, the emitter current of the transistor Q1 increases by $\Delta I$ and the emitter current of the transistor Q2 decreases by $\Delta I$.

Since the increased emitter current of the transistor Q1 increases the emitter current of the transistor Q3, the potential $V_{2c}$ drops by $\Delta I\cdot R$ and the base-emitter voltage $V_{BE3}$ increases by $\Delta V$. Since the decreased emitter current of the transistor Q2 decreases the emitter current of the transistor Q4, the potential $V_{2d}$ increases by $\Delta I\cdot R$ and the base-emitter voltage $V_{BE4}$ decreases by $\Delta V$.

For instance, when a voltage of about 1 mV is supplied between the input terminals $2a$ and $2b$ ($\Delta V=0.5$ mV), the potentials $V_{2c}$ and $V_{2d}$ respectively decreases and increases by around 15 mV and an amplified voltage of about 30 mV is obtained between the output terminals $2c$ and $2d$. In short, differential amplification similar to that performed by the differential amplifier 200 is achieved.

On the other hand, since the potentials $V_{2a}$ and $V_{2b}$ are respectively provided to the bases of the transistors Q7 and Q8, the base-emitter voltage $V_{BE7}$ of the transistors Q7 grows larger than the base-emitter voltage $V_{BE8}$ of the transistors Q8. As a result, the emitter current of the transistors Q7 increases and the emitter current of the transistors Q8 decreases.

Since the transistors Q5 and Q9 are connected in series with the transistor Q7, the increase in the emitter current of the transistor Q7 increases the emitter currents of the transistors Q5 and Q9, thereby increasing the base-emitter voltages $V_{BE5}$ and $V_{BE9}$ of the transistors Q5 and Q9, respectively. As the potential $V_{2a}$ increases and the potential $V_{2b}$ decreases each by $\Delta V$, the base-emitter voltage $V_{BE7}$ of the transistor Q7 increases and the base-emitter voltage $V_{BE8}$ of the transistor Q8 decreases. This increases the base-emitter voltages $V_{BE5}$ and $V_{BE9}$ of the transistors Q5 and Q9 each by $\Delta V$.

Here, since the base potential of the transistor Q5 is fixed at the potential $V_B$, the drop in the collector potential $V_7$ of the transistor Q7 is equal to $2\Delta V$, or the sum of the increases in the base-emitter voltages $V_{BE5}$ and $V_{BE9}$. If $\Delta V=0.5$ mV, the drop is 1 mV. In a similar manner, the increase in the collector potential $V_8$ of the transistor Q8 is equal to $2\Delta V$, or the sum of the decreases in the base-emitter voltages $V_{BE6}$ and $V_{BE10}$ of the transistors Q6 and Q10. If $\Delta V=0.5$ mV therefore, the increase is 1 mV.

On the other hand, receiving the collector potential $V_8$ of the transistor Q8, the base of the transistor Q3 allows its potential to increase by $2\Delta V$, or the sum of the decreases in the base-emitter voltages $V_{BE6}$ and $V_{BE10}$. Since the base-emitter voltage $V_{BE3}$ of the transistor Q3 increases by $\Delta V$, the emitter potential $V_3$ of the transistor Q3, namely, the collector potential of the transistor Q1 increases by $2\Delta V - \Delta V = \Delta V$.

From the above, it is understood that since an increase of $\Delta V$ in the potential $V_{2a}$ increases the collector potential $V_3$ of the transistor Q1 equally by $\Delta V$, i.e., changes by the same amount as with the potential $V_{2a}$ in phase with the potential $V_{2a}$, the base-collector voltage of the transistor Q1 does not change.

In a similar manner, since the collector potential $V_7$ of the transistor Q7 is given to the base of the transistor Q4, the potential at the base of the transistor Q4 decreases by $2\Delta V$, or the sum of the increases in the base-emitter voltages $V_{BE5}$ and $V_{BE9}$. Meanwhile, the base-emitter voltage $V_{BE4}$ of the transistor Q4 decreases by $\Delta V$, and therefore, the emitter potential $V_4$ of the transistor Q4, namely, the collector potential of the transistor Q2 falls by $2\Delta V - \Delta V = \Delta V$. Since the potential $V_{2b}$ decreases by $\Delta V$, the base-collector voltage of the transistor Q2 does not change.

This situation occurs at time $t_1$ in FIG. 3, and can be explained as follows using equations. Ignoring the base currents and assuming that the potentials $V_{2a}$ and $V_{2b}$ equally sit at $V_0$, currents which flow between the collector and the emitter of each one of the transistors Q1 and Q2 are the same $I_0=I_a/2$. Even if the potential $V_{2a}$ grows to $V_0+\Delta V$ and the potential $V_{2b}$ drops to $V_0-\Delta V$, since the transistors Q1 and Q2 have the same design, the emitter potentials $V_Q$ of the transistors Q1 and Q2 do not change, permitting the emitter current of the transistor Q1 to increase to $I_0+\Delta I$ and the emitter current of the transistor Q2 to decrease to $I_0-\Delta I$. The change in the base-emitter voltage $V_{BE1}$ of the transistor Q1 is equal to $\Delta V$ since the potentials $V_Q$ do not change, whereby Eq. (1) is satisfied. Therefore, from Eq. (2), it is understood that the changes in the base-emitter voltages $V_{BE3}$, $V_{BE5}$ and $V_{BE9}$ of the transistors Q3, Q5 and Q9 are each equal to $\Delta V$. Likewise, the changes in the base-emitter voltages $V_{BE4}$, $V_{BE6}$ and $V_{BE10}$ of the transistors Q4, Q6 and Q10 are each equal to $\Delta V$.

On the other hand, since the transistors Q6, Q10, Q3 and Q1 are connected to each other in the manner described above, the equation below is satisfied:

$$V_3 = V_B - V_{BE6} - V_{BE10} - V_{BE3}$$

$$V_3 = V_Q + V_{BE1} + V_{BC1} \qquad (5)$$

From Eq. (5), the relation below is found in which the left-hand side has a constant value.

$$V_B - V_Q = (V_{BE1} + V_{BE3}) + (V_{E6} + V_{BE10}) + V_{BC1} \qquad (6)$$

In the right-hand side of Eq. (6), $(V_{BE1}+V_{BE3})$ increases by $2\Delta V$ and $(V_{BE6}+V_{BE10})$ decreases by $2\Delta V$. Hence, the base-collector voltage $V_{BC1}$ is constant. This is also true when the potential $V_{2a}$ is reduced $V_0-\Delta V$ and the potential $V_{2b}$ is raised to $V_0+\Delta V$.

Thus, Miller effect is almost completely suppressed in the transistor Q1, whereby an increase in the input capacitance at the input terminal $2a$ is prevented. An increase in the input capacitance at the input terminal $2b$ is also prevented in a similar manner.

(C-5) Further Preferable Embodiment

As compared with the conventional differential amplifiers 200 and 201, the differential amplifier 101, due to the constant current source $1b$ additionally disposed therein, comprises an increased number of the constant current sources and an increased number of the transistors which are connected to the input terminals $2a$ and $2b$. This inevitably increases the consumption current and the input capacitances, which situation should be preferably avoided. Such increases can be suppressed by setting the current value $I_b$ of the constant current source $1b$ smaller than the current value $I_a$ of the constant current source $1a$ and forming the emitter areas of the transistors Q7 and Q8 smaller than those of the transistors Q1 and Q2.

Of course, if an increase in the consumption current is not likely to cause a problem, the current value $I_b$ of the constant current source $1b$ needs not be set smaller than the current value $I_a$ of the constant current source $1a$. With respect to the emitter surface areas of the transistors Q7 and Q8, since the collector currents of the transistors Q7 and Q8 do not exert any influence over the potentials at the output terminals $2c$ and $2d$, a change in a parasitic capacitance between the base and the collector of any one of the transistors Q7 and Q8 is not particularly unadvantageous. Therefore, it is not always necessary to form the emitter areas of the transistors Q7 and Q8 smaller than those of the transistors Q1 and Q2.

D. Second Preferred Embodiment

Figure 4:
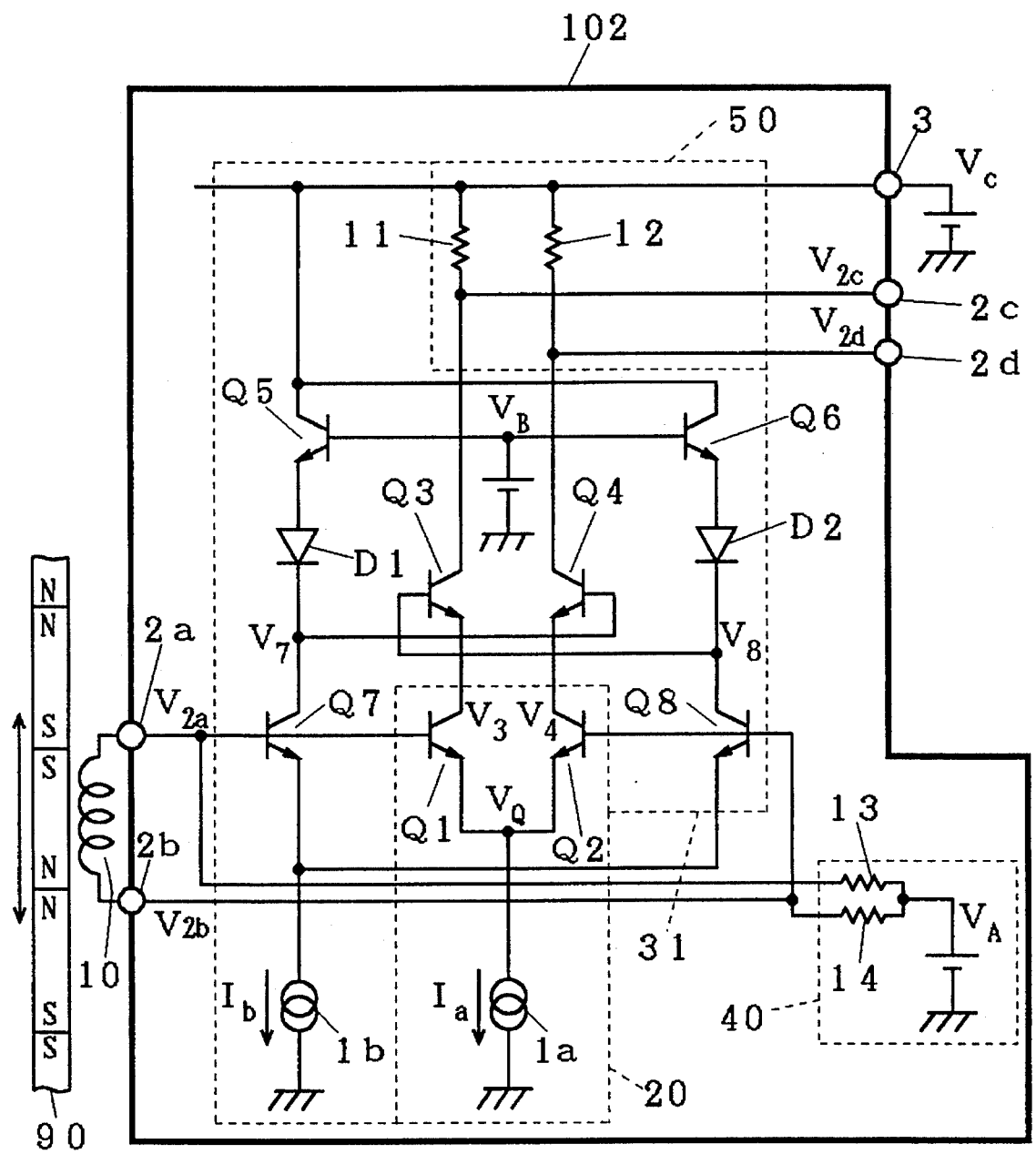
FIG. 4 is a circuitry diagram showing a structure according to a second preferred embodiment of the present invention.

FIG. 4 is a circuitry diagram showing a structure of a differential amplifier 102 according to a second preferred embodiment of the present invention. The differential amplifier 102 is equivalent to the differential amplifier 101 as it is modified to replace the NPN transistors Q9 and Q10 with diodes D1 and D2, respectively.

In the present invention, it is only necessary that Schockley's equation (Eq. 1) is satisfied. Hence, use of the diodes D1 and D2 which have same characteristics to replace the transistors Q9 and Q10 nevertheless produces the aforedescribed effect of the invention.

E. Third Preferred Embodiment

Figure 5:
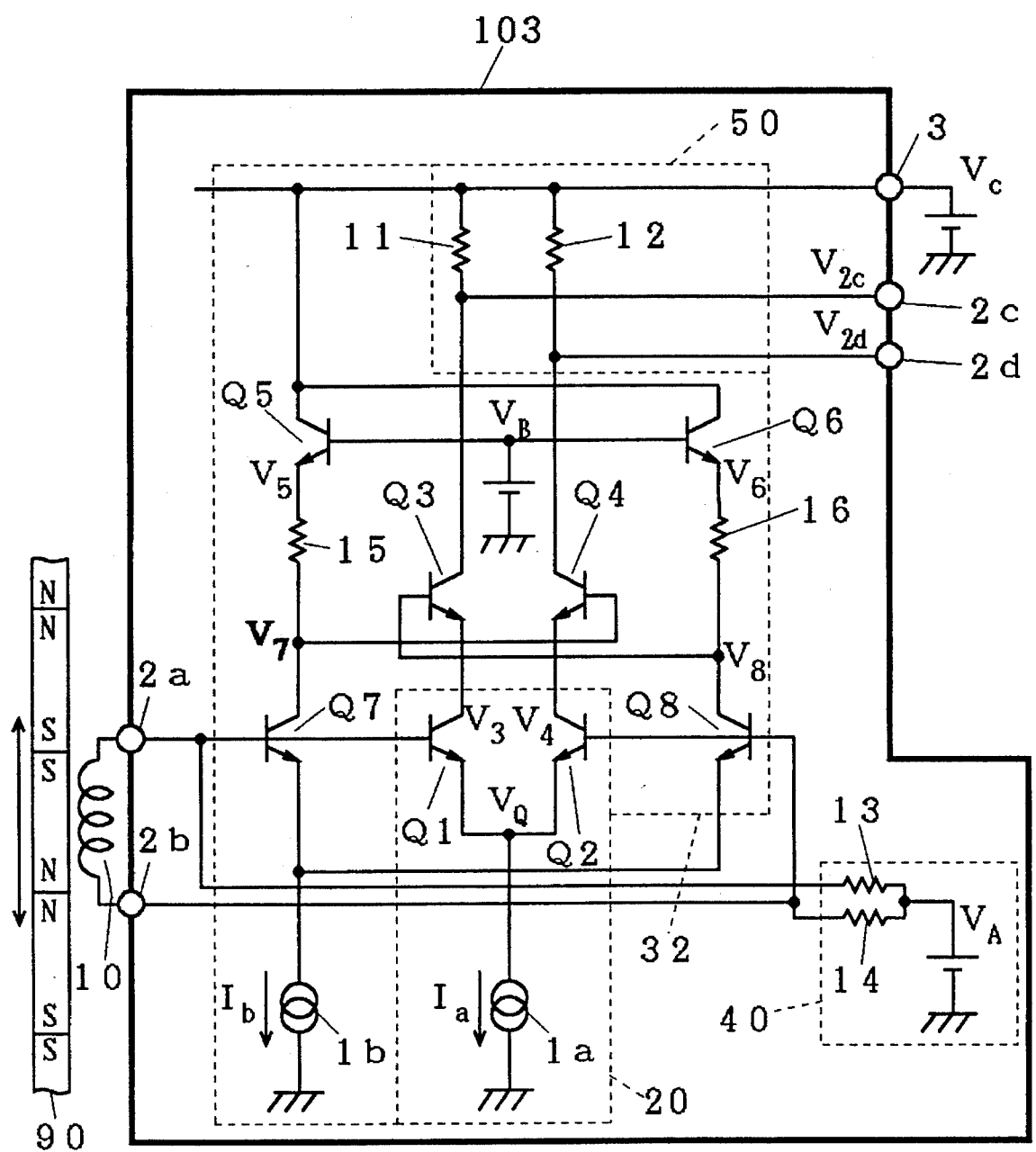
FIG. 5 is a circuitry diagram showing a structure according to a third preferred embodiment of the present invention.
Figure 6:
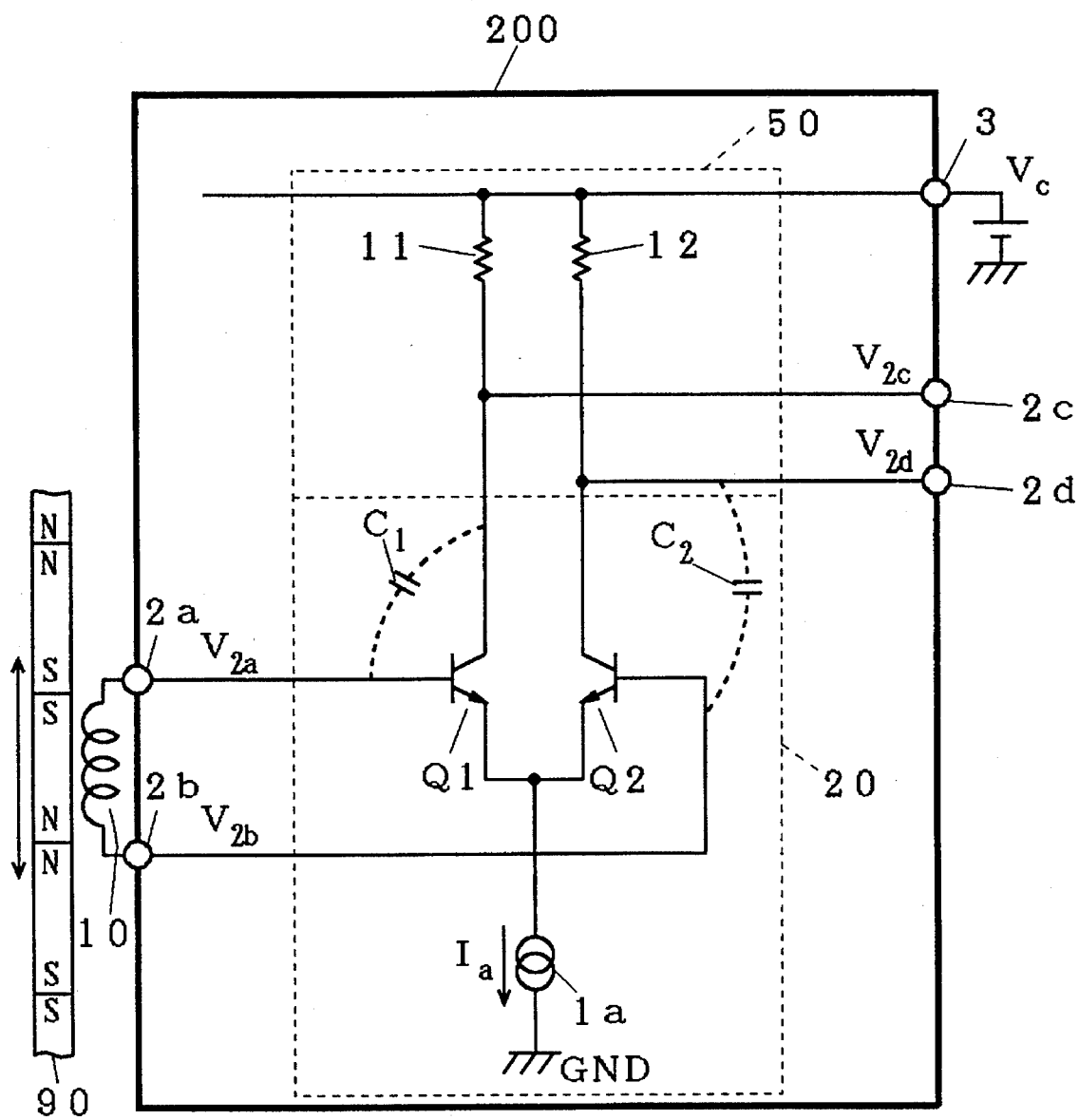
FIG. 6 is a circuitry diagram showing a structure of a conventional differential amplifier.
Figure 7:
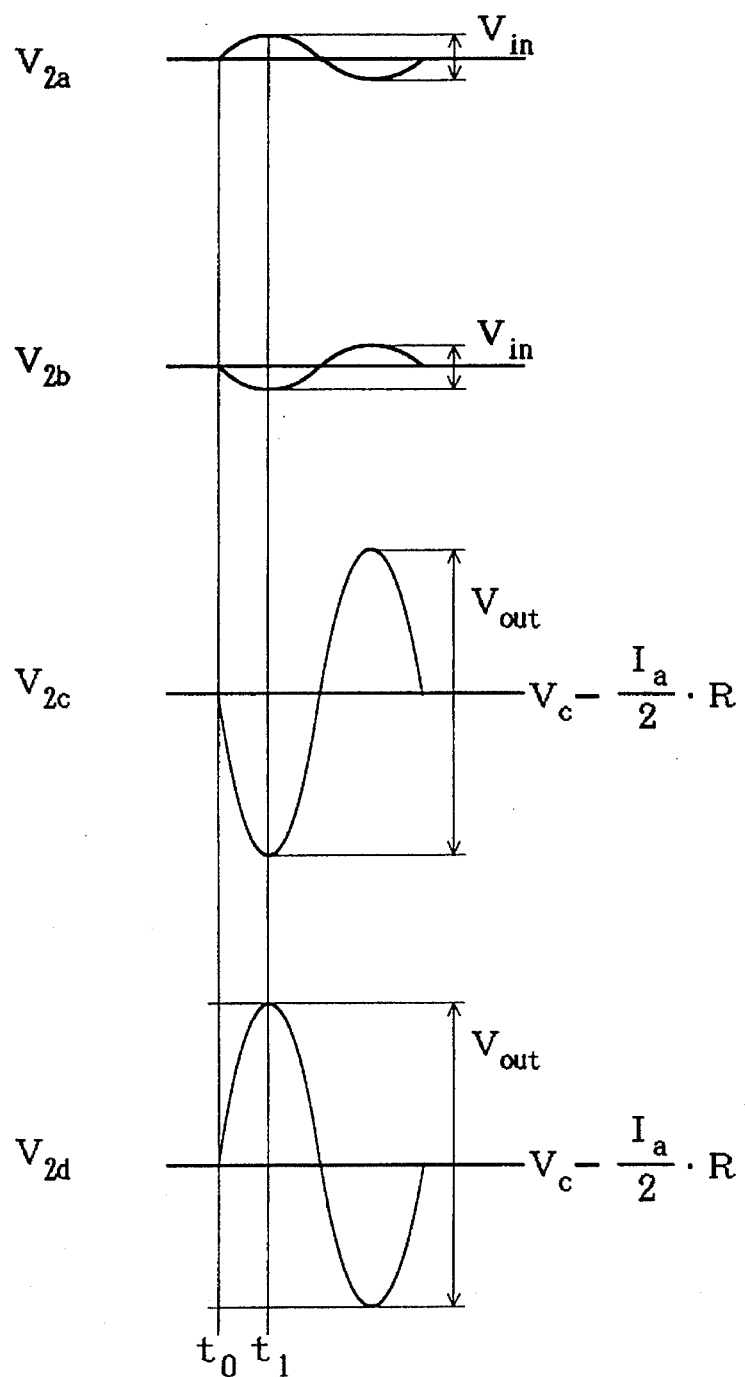
FIGS. 7 and 8 are graphs showing operations of the conventional differential amplifier.
Figure 8:
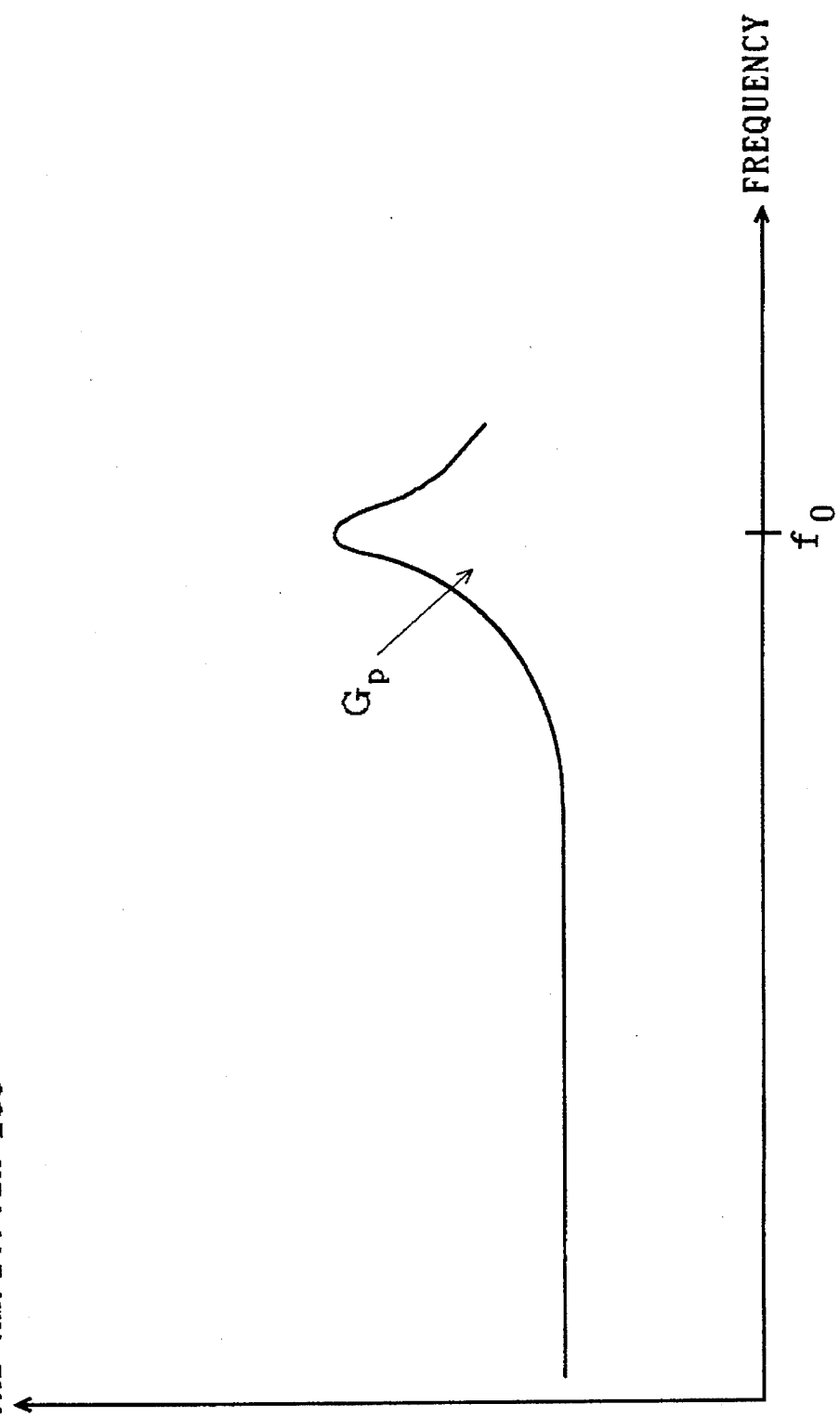
Figure 9:
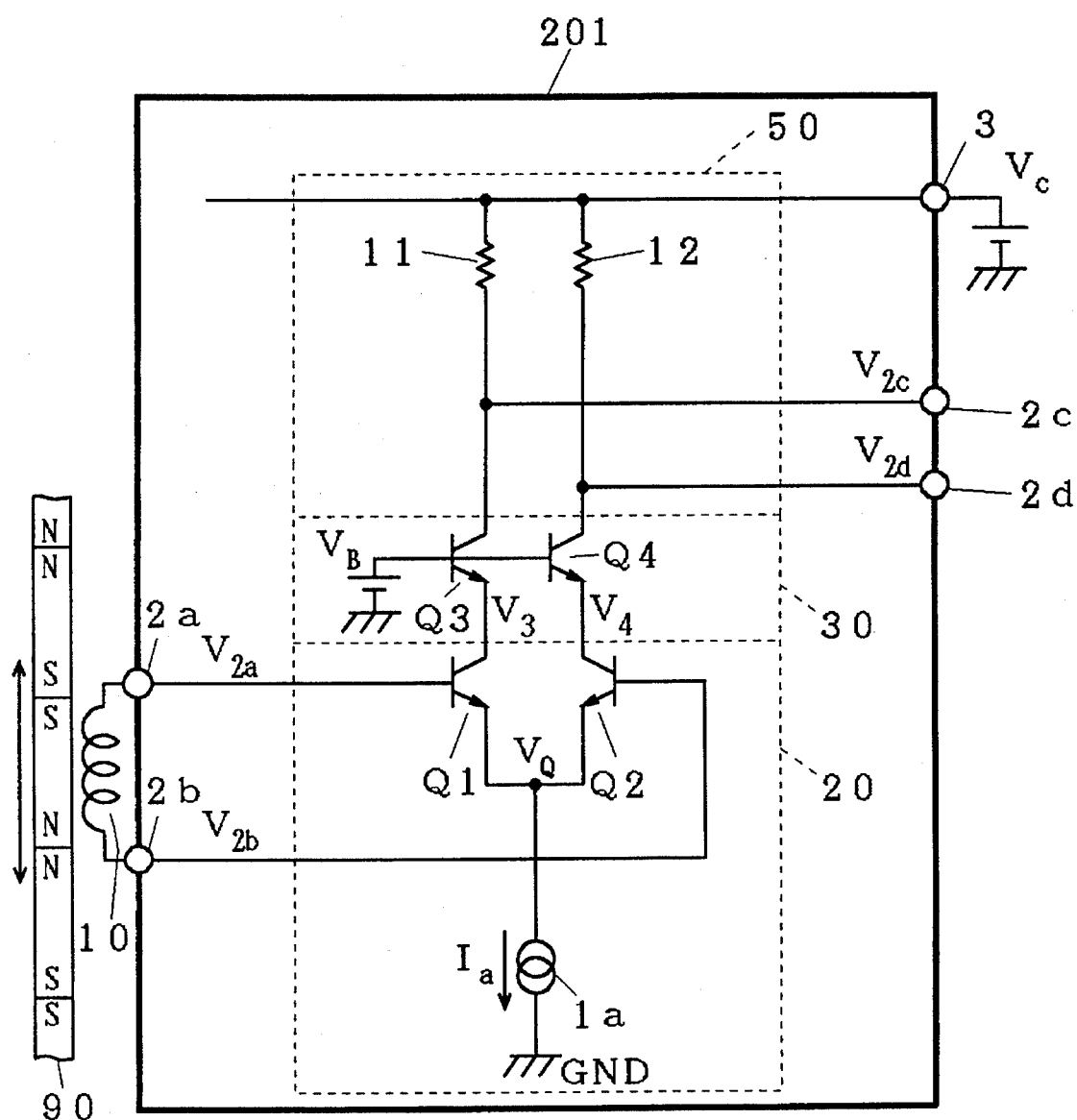
FIG. 9 is a circuitry diagram showing a structure of another conventional differential amplifier.
Figure 10:
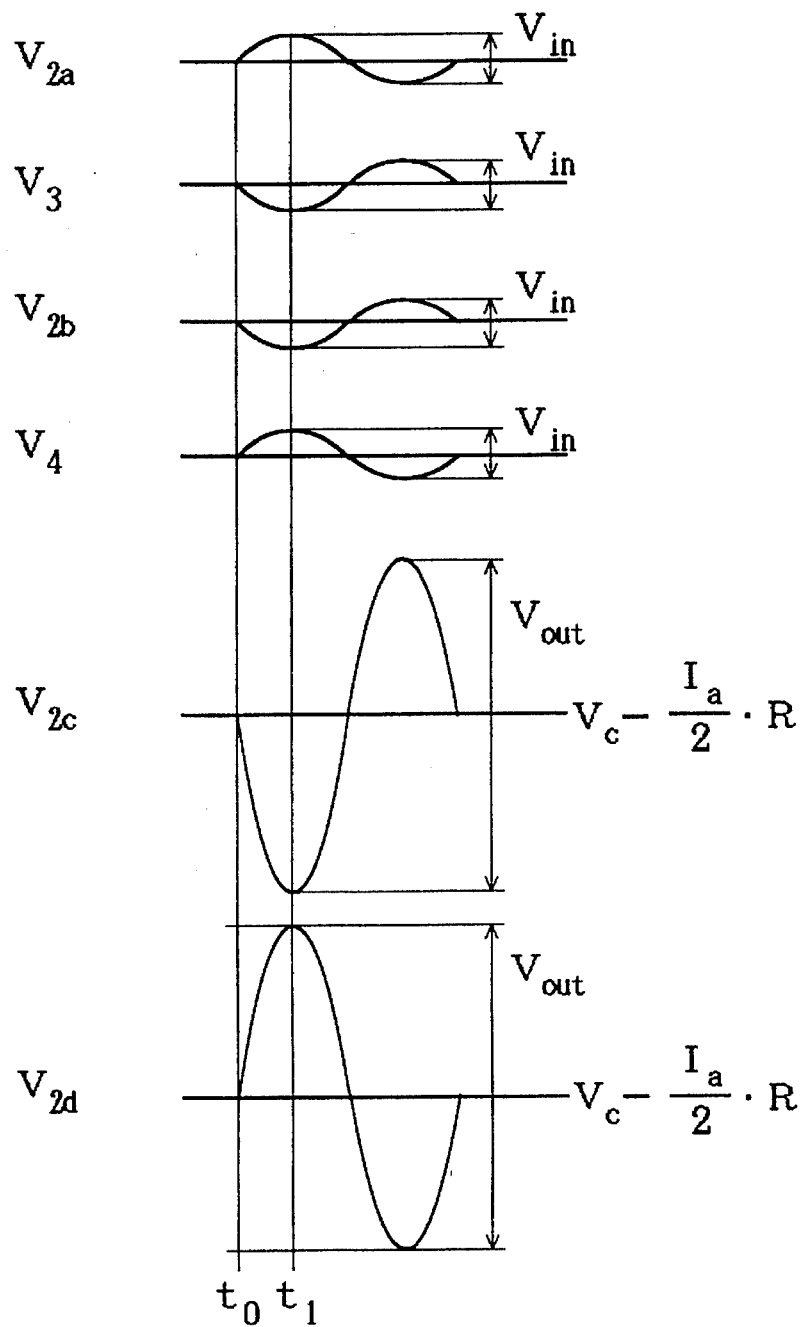
FIG. 10 is a graph showing an operation of the conventional differential amplifier.

FIG. 5 is a circuitry diagram showing a structure of a differential amplifier 103 according to a third preferred embodiment of the present invention. The differential amplifier 103 is equivalent to the differential amplifier 101 as it is modified to replace the NPN transistors Q9 and Q10 with resistors 15 and 16, respectively.

In the differential amplifier 101, the collector-emitter voltages of the transistors Q9 and Q10 are equal to the base-emitter voltages of the transistors Q9 and Q10. When the potential $V_{2a}$ increases by $\Delta V$, the base-emitter voltage of the transistor Q9 increases by $\Delta V$ while the base-emitter voltage of the transistor Q10 decreases by $\Delta V$. Hence, by setting the resistances of the resistors 15 and 16 so that voltage drops at the resistors 15 and 16 become $\Delta V$ and $-\Delta V$, respectively, an effect similar to that attained in the differential amplifier 101 is created.

To be more specific, assume that the potential $V_{2a}$ changes from $V_0$ to $V_0 + \Delta V$ and the potential $V_{2b}$ changes from $V_0$ to $V_0 - \Delta V$. If the increase of $\Delta V$ in the potential $V_{2a}$, i.e., the base current of the transistor Q7 increases the emitter current of the transistor Q7 from $I_0$ to $I_0 + \Delta I$, a voltage drop at the resistor 15 is $\Delta I \cdot R_{15}$ where $R_{15}$ is the resistance of the resistor 15. Meanwhile, since the emitter current of the transistor Q5 similarly grows from $I_0$ to $I_0 + \Delta I$, the base-emitter voltage of the transistor Q5 increases by $\Delta V$. Hence, by setting the resistance $R_{15}$ and an amount of change in the current $\Delta I$ such that the voltage drop $\Delta I \cdot R_{15}$ at the resistor 15 is equal to $\Delta V$, the potential $V_7$ at the base of the transistor Q4 is reduced by $2\Delta V$. Since the base-emitter voltage of the transistor Q4 decreases by $\Delta V$, the emitter potential $V_4$ of the transistor Q4 (i.e., the collector potential of the transistor Q2) decreases by $\Delta V$. Similarly, by setting the resistance $R_{16}$ and the amount of change in the current $\Delta I$ appropriately, the collector potential $V_3$ of the transistor Q3 is increased by $\Delta V$. Hence, an effect similar to that attained in the differential amplifier 101 is promised.

In the differential amplifier 103, fine adjustment of potential changes at the collectors of the transistors Q1 and Q2 is much easier. This is because the resistors 15 and 16 which have replaced the transistors Q9 and Q10 of the differential amplifier 101 are easily processed by trimming or other suitable techniques than transistor elements.

While the invention has been described in detail, the foregoing description is in all aspects illustrative and not restrictive. It is understood that numerous other modifications and variations can be devised without departing from the scope of the invention.

We claim:

1. A differential amplifier, comprising:

(a) a first and a second input terminals;

(b) a first differential input part, including:
     (b-1) a first amplifier element including an input terminal and an output terminal, said input terminal of said first amplifier being connected to said first input terminal;
     (b-2) a second amplifier element including an input terminal and an output terminal, said input terminal of said second amplifier being connected to said second input terminal; and
     (b-3) a first current source which is connected at a first contact point to said first and said second amplifier elements, said first current source maintaining a sum of currents which flow from said output terminals of said first and said second amplifier elements at a first constant current value;

(c) a second differential input part, including:
     (c-1) a third amplifier element including an input terminal and an output terminal, said input terminal of said third amplifier being connected to said first input terminal;
     (c-2) a fourth amplifier element including an input terminal and an output terminal, said input terminal of said fourth amplifier being connected to said second input terminal; and
     (c-3) a second current source which is connected at a second contact point to said third and said fourth amplifier elements, said second current source maintaining a sum of currents which flow from said output terminals of said third and said fourth amplifier elements at a second constant current value;

(d) a first current/voltage conversion element including an input terminal and an output terminal which is connected to said output terminal of said third amplifier element;

(e) a second current/voltage conversion element including an input terminal and an output terminal which is connected to said output terminal of said fourth amplifier element;

(f) a third current/voltage conversion element including an input terminal which is provided with a fixed potential and an output terminal which is connected to said input terminal of said first current/voltage conversion element;

(g) a fourth current/voltage conversion element including an input terminal which is provided with said fixed potential and an output terminal which is connected to said input terminal of said second current/voltage conversion element;

(h) a fifth current/voltage conversion element including an input terminal which is connected to said output terminal of said second current/voltage conversion element and an output terminal which is connected to said output terminal of said first current/voltage conversion element;

(i) a sixth current/voltage conversion element including an input terminal which is connected to said output terminal of said first current/voltage conversion element and an output terminal which is connected to said output terminal of said second current/voltage conversion element;

(j) a seventh current/voltage conversion element for converting a current which flows through said fifth current/voltage conversion element into a voltage; and (k) an eighth current/voltage conversion element for converting a current which flows through said sixth current/voltage conversion element into a voltage, wherein in said first amplifier element, a potential difference between its input and output terminals is expressed as a multiplication product of logarithms of currents which flow into and from its input and output terminals and a first coefficient, in said second amplifier element, a potential difference between its input and output terminals is expressed as a multiplication product of logarithms of currents which flow into and from its input and output terminals and said first coefficient, in said third amplifier element, a potential difference between its input and output terminals is expressed as a multiplication product of logarithms of currents which flow into and from its input and output terminals and a second coefficient, in said fourth amplifier element, a potential difference between its input and output terminals is expressed as a multiplication product of logarithms of currents which flow into and from its input and output terminals and said second coefficient, in said first current/voltage conversion element, a potential difference between its input and output terminals is expressed as a multiplication product of logarithms of currents which flow into and from its input and output terminals and a third coefficient, in said second current/voltage conversion element, a potential difference between its input and output terminals is expressed as a multiplication product of logarithms of currents which flow into and from its input and output terminals and said third coefficient, in said third current/voltage conversion element, a potential difference between its input and output terminals is expressed as a multiplication product of logarithms of currents which flow into and from its input and output terminals and a fourth coefficient, in said fourth current/voltage conversion element, a potential difference between its input and output terminals is expressed as a multiplication product of logarithms of currents which flow into and from its input and output terminals and said fourth coefficient, in said fifth current/voltage conversion element, a potential difference between its input and output terminals is expressed as a multiplication product of logarithms of currents which flow into and from its input and output terminals and a fifth coefficient, in said sixth current/voltage conversion element, a potential difference between its input and output terminals is expressed as a multiplication product of logarithms of currents which flow into and from its input and output terminals and said fifth coefficient, and potentials supplied to said first and said second input terminals are amplified and respectively fed to said seventh and said eighth current/voltage conversion elements.

2. The differential amplifier of claim 1, wherein potentials supplied to said first and said second input terminals have such values which force said first and said second contact points to each stay at a constant potential.

3. The differential amplifier of claim 2, wherein potentials which complement one another are supplied to said first and said second input terminals.

4. The differential amplifier of claim 3, wherein a coil is connected to said first and said second input terminals, and changes in a magnetic field which develops in the vicinity of said coil are converted into potentials and supplied to said first and said second input terminals.

5. The differential amplifier of claim 4, wherein said magnetic field changes as a magnetic recording medium moves, and said coil is a head coil which is used in correspondence to said magnetic recording medium.

6. The differential amplifier of claim 5, wherein said magnetic recording medium is a hard disk.

7. The differential amplifier of claim 5, wherein said magnetic recording medium is a flexible disk.

8. The differential amplifier of claim 2, wherein said first amplifier element includes (b-1-1) a first transistor having a control electrode which is connected to said input terminal of said first amplifier element, a first electrode which is connected to said output terminal of said first amplifier element and a second electrode which is connected to said first contact point, said second amplifier element includes (b-2-1) a second transistor having a control electrode which is connected to said input terminal of said second amplifier element, a first electrode which is connected to said output terminal of said second amplifier element and a second electrode which is connected to said first contact point, and said first and said second transistors are constructed to have the same design.

9. The differential amplifier of claim 8, wherein said third amplifier element includes (c-1-1) a third transistor having a control electrode which is connected to said input terminal of said third amplifier element, a first electrode which is connected to said output terminal of said first amplifier element and a second electrode which is connected to said second contact point, said fourth amplifier element includes (c-2-1) a fourth transistor having a control electrode which is connected to said input terminal of said fourth amplifier element, a first electrode which is connected to said output terminal of said fourth amplifier element and a second electrode which is connected to said second contact point, and said third and said fourth transistors are constructed to have the same design.

10. The differential amplifier of claim 9, wherein said first current/voltage conversion element includes (d-1) a fifth transistor having a control electrode and a first electrode which are connected in common to said input terminal of said first current/voltage conversion element and a second electrode which is connected to said output terminal of said first current/voltage conversion element, said second current/voltage conversion element includes (e-1) a sixth transistor having a control electrode and a first electrode which are connected in common to said input terminal of said second current/voltage conversion element and a second electrode which is connected to said output terminal of said second current/voltage conversion element, and said fifth and said sixth transistors are constructed to have the same design.

11. The differential amplifier of claim 9, wherein said first current/voltage conversion element includes (d-2) a first diode having a first end which is connected to said input terminal of said first current/voltage conversion element and a second end which is connected to said output terminal of said first current/voltage conversion element, said second current/voltage conversion element includes (e-2) a second diode having a first end which is connected to said input terminal of said second current/ voltage conversion element and a second end which is connected to said output terminal of said second current/voltage conversion element, and said first and said second diodes are constructed to have the same design.

12. The differential amplifier of claim 9, wherein said first current/voltage conversion element includes (d-3) a first resistor having a first end which is connected to said input terminal of said first current/voltage conversion element and a second end which is connected to said output terminal of said first current/voltage conversion element, said second current/voltage conversion element includes (e-3) a second resistor having a first end which is connected to said input terminal of said second current/voltage conversion element and a second end which is connected to said output terminal of said second current/voltage conversion element, and said first and said second resistors are constructed to have the same design.

13. The differential amplifier of claim 10, wherein said third current/voltage conversion element includes (f-1) a seventh transistor having a control electrode which is connected to said input terminal of said third current/voltage conversion element, a first electrode and a second electrode which is connected to said output terminal of said third current/voltage conversion element, said fourth current/voltage conversion element includes (g-1) an eighth transistor having a control electrode which is connected to said input terminal of said fourth current/voltage conversion element, a first electrode and a second electrode which is connected to said output terminal of said fourth current/voltage conversion element, seventh and said eighth transistors are constructed to have the same design, and equal potentials are supplied to said first electrodes of said seventh and said eighth transistors.

14. The differential amplifier of claim 13, wherein said fifth current/voltage conversion element includes (h-1) an ninth transistor having a control electrode which is connected to said input terminal of said fifth current/voltage conversion element, a first electrode which is connected to said seventh current/voltage conversion element and a second electrode which is connected to said output terminal of said fifth current/voltage conversion element, said sixth current/voltage conversion element includes (i-1) a tenth transistor having a control electrode which is connected to said input terminal of said sixth current/voltage conversion element, a first electrode which is connected to said eighth current/voltage conversion element and a second electrode which is connected to said output terminal of said sixth current/voltage conversion element, said ninth and said tenth transistors are constructed to have the same design, and said first electrodes of said ninth and said tenth transistors are connected to each other via said seventh and said eighth current/voltage conversion elements which are connected in series to each other.

15. The differential amplifier of claim 14, wherein said seventh current/voltage conversion element includes (j-1) a first resistor having a first end and a second end, said first end of said first resistor being connected to said first electrode of said ninth transistor, said eighth current/voltage conversion element includes (k-1) a second resistor having a first end and a second end, said first end of said second resistor being connected to said first electrode of said tenth transistor, and equal potentials are supplied to said second ends of said first and said second resistors.

16. The differential amplifier of claim 1, further comprising a bias circuit which biases both said first and said second input terminals.

* * * * *

UNITED STATES PATENT AND TRADEMARK OFFICE
CERTIFICATE OF CORRECTION

PATENT NO. : 5,453,718
DATED : September 26, 1995
INVENTOR(S) : Katuyuki KUROKAWA, et al.

It is certified that error appears in the above-indentified patent and that said Letters Patent is hereby corrected as shown below:

On the title page, Item [54] and Column 1, Lines 1-4, the title should read:

--DIFFERENTIAL AMPLIFIER FOR REDUCING INPUT CAPACITANCE WITHOUT DETERIORATING NOISE CHARACTERISTICS--

Signed and Sealed this

Fourteenth Day of November, 1995

*Attest:*

BRUCE LEHMAN

*Attesting Officer*   *Commissioner of Patents and Trademarks*